(12) United States Patent
Lin

(10) Patent No.: US 7,119,002 B2
(45) Date of Patent: Oct. 10, 2006

(54) SOLDER BUMP COMPOSITION FOR FLIP CHIP

(75) Inventor: Kuo-Wei Lin, Shinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/012,032

(22) Filed: Dec. 14, 2004

(65) Prior Publication Data

US 2006/0128135 A1 Jun. 15, 2006

(51) Int. Cl.
*H01L 21/44* (2006.01)

(52) U.S. Cl. .................................................. 438/612

(58) Field of Classification Search ........ 438/107–114, 438/117–127, 207, 218, 612–615
See application file for complete search history.

(56) References Cited

U.S. PATENT DOCUMENTS

| 4,908,696 | A | * | 3/1990 | Ishihara et al. | ............. 257/713 |
| 6,541,366 | B1 | | 4/2003 | Chin et al. | |
| 6,740,577 | B1 | * | 5/2004 | Jin et al. | ..................... 438/612 |
| 6,818,545 | B1 | * | 11/2004 | Lee et al. | ................... 438/614 |

* cited by examiner

*Primary Examiner*—Michael Lebentritt
*Assistant Examiner*—Andre' Stevenson
(74) *Attorney, Agent, or Firm*—Duane Morris LLP

(57) ABSTRACT

It is an object of the present invention to provide a method for solder bump formation using a combination of eutectic and high lead solders. The present invention provides a method for improving a solder bump composition for a flip chip.

6 Claims, 6 Drawing Sheets

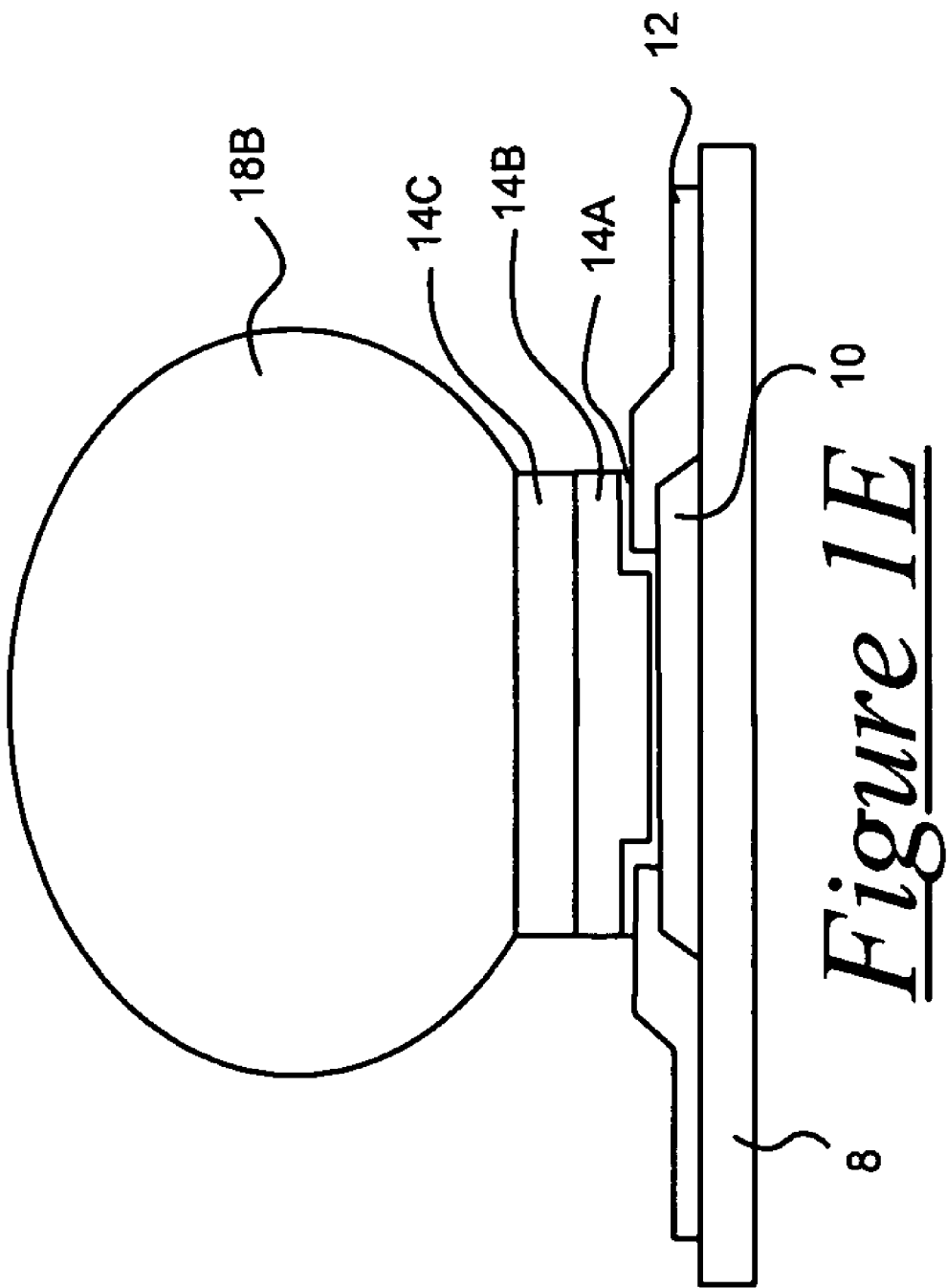

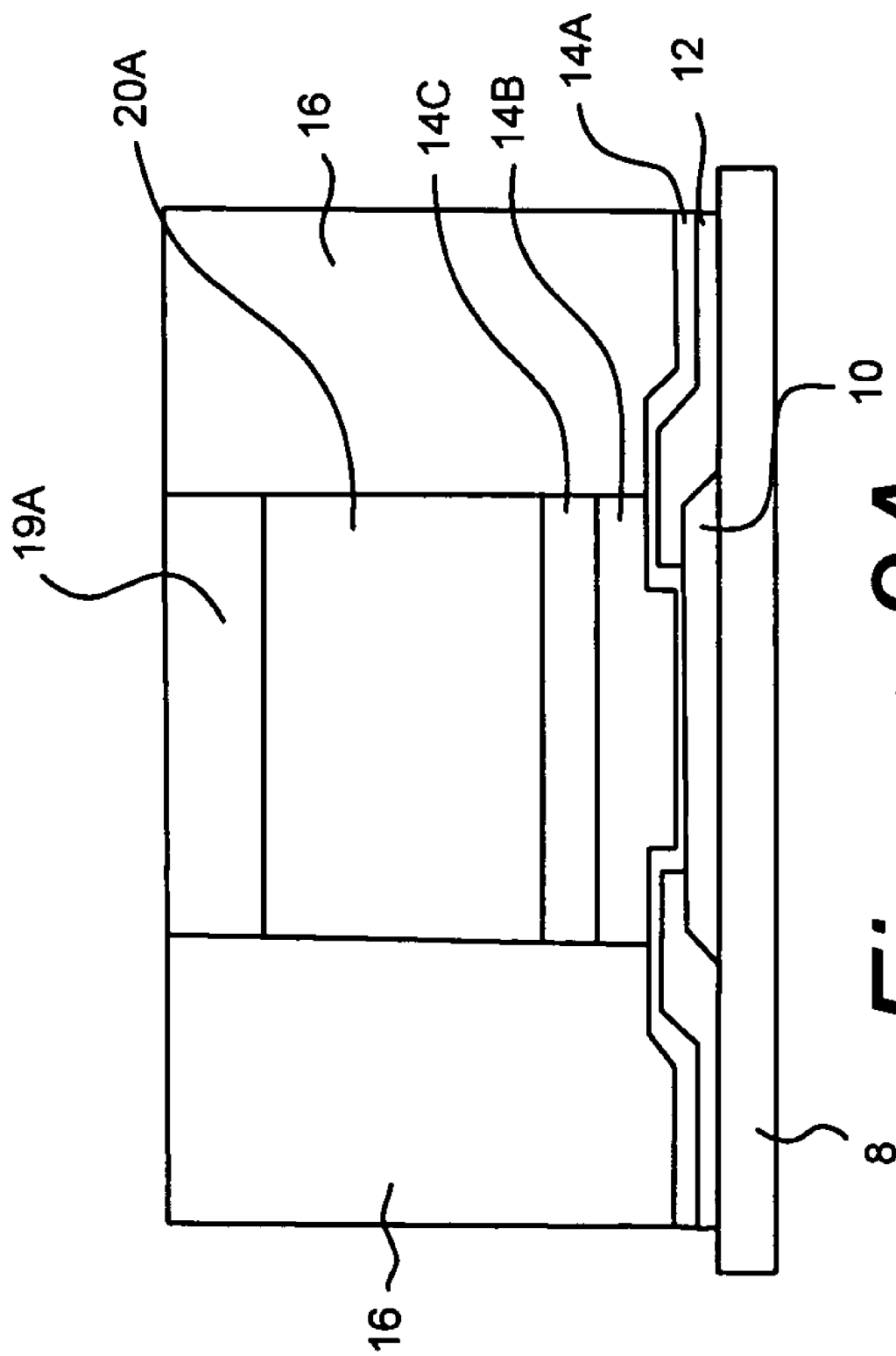

SOLDER BUMP COMPOSITION FOR FLIP CHIP

FIELD OF THE INVENTION

The present invention generally relates to flip chip bonding technology, and more particularly to an improved solder bump composition.

BACKGROUND OF THE INVENTION

Packaging of the Ultra Large Scale Integration (ULSI) chip is one of the most important steps in ULSI manufacturing, contributing significantly to the overall cost, performance and reliability of the packaged chip. As semiconductor devices reach higher levels of integration, packaging technologies such as chip bonding have become increasingly important. Packaging of the chip accounts for a considerable portion of the cost of producing the device, and failure of the package leads to costly yield reduction.

As semiconductor device sizes have decreased, the density of devices on a chip has increased along with the size of the chip, thereby making chip bonding more challenging. One of the major problems leading to package failure as chip sizes increase is the increasingly difficult problem of thermal coefficient of expansion (TCE) mismatches between materials, leading to stress buildup and consequent failure. For example, in flip chip technology, chip bonding is accomplished by means of solder bumps formed on under bump metallization (UBM) layers overlying a chip bonding pad where, frequently, improper wetting (bonding) between the solder and UBM layers may lead to a bond not sufficiently strong to withstand such stresses.

In many cases, it is necessary to repackage the chip after a package failure, requiring costly detachment of the chip from the package and repeating the chip bonding process in a new package. Some chip bonding technologies utilize a solder bump attached to a contact pad (chip bonding pad) on the chip to make an electrical connection from the chip devices to the package. For example, C4 (Controlled-Collapse Chip Connection) is a means of connecting semiconductor chips to substrates in electronic packages. C4 is a flip-chip technology in which the interconnections are small solder balls (bumps) on the chip surface. Since the solder balls form an area array, C4 technology can achieve the highest density scheme known in the art for chip interconnections. The flip chip method has the advantage of achieving the highest density of interconnection to the device with the lowest parasitic inductance.

Solder bumps may be formed by, for example, vapor deposition of solder material over layers of under bump metallization (UBM) formed on the chip bonding pad. In another method, the layers of solder material may be deposited by electrodeposition onto a seed layer material deposited over UBM layers formed on the chip bonding pad. In yet another method, solder bumps may be formed by a solder-paste screen printing method using a mask (stencil) to guide the placement of the solder-paste. Typically, after deposition of the solder materials, for example, in layers or as a homogeneous mixture, the solder bump (ball) is formed after removing a photoresist mask defining the solder material location, by heating the solder material to a melting point where according to a reflow process, a solder ball is formed with the aid of surface tension. Alternatively, a solder bump (column) may be formed within a permanent mask made of photoresist or some other organic resinous material defining the solder bump area over the chip bonding pad.

In an exemplary process for forming a solder bump on a semiconductor chip, reference is made to FIGS. 1A–1E, representative of cross sections of an exemplary chip bonding pad and associated UBM layers and solder bump for chip bonding in flip chip technology. For example, with reference to FIG. 1A, the process of creating the solder bumps begins after chip bonding pad 10, for example Cu or Al, formed by vapor deposition, has been deposited on the surface of the semiconductor wafer 8. After the chip bonding pad 10 is formed, a passivation layer 12 of, for example, silicon dioxide ($SiO_2$) is formed over the semiconductor device surface excluding a portion overlying the chip bonding pad 10. Typically, one or more under bump metallization (UBM) layers, e.g., 14A of from about 500 Angstroms to about 5000 Angstroms are then deposited over chip bonding pad 10 and a layer of photoresist 16 formed thereover, as shown in FIG. 1B. The UBM layer 14A may be, for example, a layer of titanium. The photoresist layer is typically from about 10 to about 25 microns high. As shown in FIG. 1B, the photoresist layer 16 is photolithographically patterned and developed to form an opening 17 above the contact pad 10 to expose the UBM layer, e.g., 14A. Additional UBM layers may be formed within the mask opening 17 by, for example, an electroplating process or vapor deposition process forming e.g., UBM layers 14B and 14C in FIG. 1C. Layers 14B and 14C may be, for example, layers of copper and nickel, respectively. UBM layers are formed over the chip bonding pad 10, for example, to allow for better bonding and wetting of the solder material to the uppermost UBM layer adjacent the solder material, e.g., 14C, and for protection of the chip bonding pad 10 by the lowermost UBM layer, e.g., 14A. A column of solder material 18A may either be deposited in layers, for example, a layer of Pb followed by a layer of Sn, the solder material layers later being formed into a homogeneous solder during reflow, or may be deposited as a homogeneous solder material by, e.g., vapor deposition or electroplating onto a seed layer (e.g., 14C).

After removal of the photoresist layer 16, the UBM layer 14A is etched through by a reactive ion etch (RIE) process to the underlying passivation layer 12 using the solder column 18A as an etching mask to protect the underlying UBM layers 14A, 14B, and 14C, as shown in FIG. ID. The solder column 18 is then heated to reflow to form a solder bump 18B over the UBM layer 14C, as shown in FIG. 1E. After reflow, a homogeneous Pb/Sn solder bump is formed including, for example, with composition ratios indicating weight percent, high lead alloys including 95 Pb/5 Sn (95/5) or 90 Pb/10 Sn (90/10) with melting temperatures in excess of 300° C. or eutectic 63 Pb/37 Sn (63/37) with a melting temperature of about 180° C. The solder bump forms a homogeneous material and has a well defined melting temperature. For example, the high melting Pb/Sn alloys are reliable bump metallurgies which are particularly resistant to material fatigue.

There is a need in the semiconductor processing art to develop improved solder bump compositions. As noted above, two major solder bump compositions are used in semiconductor assembly: (1) eutectic and (2) high lead. High lead solders have high performance characteristics, while eutectic solders have lower associated package costs. It is therefore an object of the invention to provide a method for solder bump formation using a combination of eutectic and high lead solders.

SUMMARY OF THE INVENTION

To achieve the foregoing and other objects, and in accordance with the purposes of the present invention, as embodied and broadly described herein, a method is disclosed for improving a solder bump composition for a flip chip, comprising the steps of: providing at least two UBM layers overlying a chip bonding pad including an uppermost UBM layer forming a contact layer for forming a solder bump thereon; depositing a solder bump precursor material overlying the contact layer to form a solder column, wherein said solder bump precursor material contains a combination of high lead and eutectic solders; exposing the sidewalls of the solder column to include the contact layer sidewalls; oxidizing the contact layer sidewalls to form a contact layer sidewall oxide at a temperature lower than the melting point of the solder bump precursor material to make the contact layer sidewalls unwettable in a subsequent reflow process; and, forming a solder bump by reflowing the precursor material to wet the contact layer surface to exclude the contact layer sidewalls, whereby the solder bump contains high lead solder with a layer of eutectic solder encompassing the high lead region of the bump.

BRIEF DESCRIPTION OF THE DRAWINGS

FIGS. 1A–1E are cross-sectional side view representations of an exemplary process of forming a solder bump over a chip bonding pad at stages in a manufacturing process.

FIGS. 2A–2C are cross-sectional side view representations of an exemplary process of forming an improved solder bump over a chip bonding pad at stages in a manufacturing process, in accordance with the present invention.

DETAILED DESCRIPTION OF THE INVENTION

Figure 1A:
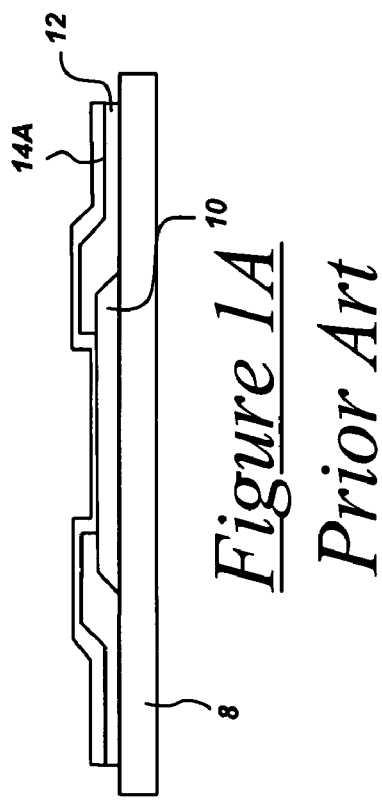
Figure 1B:
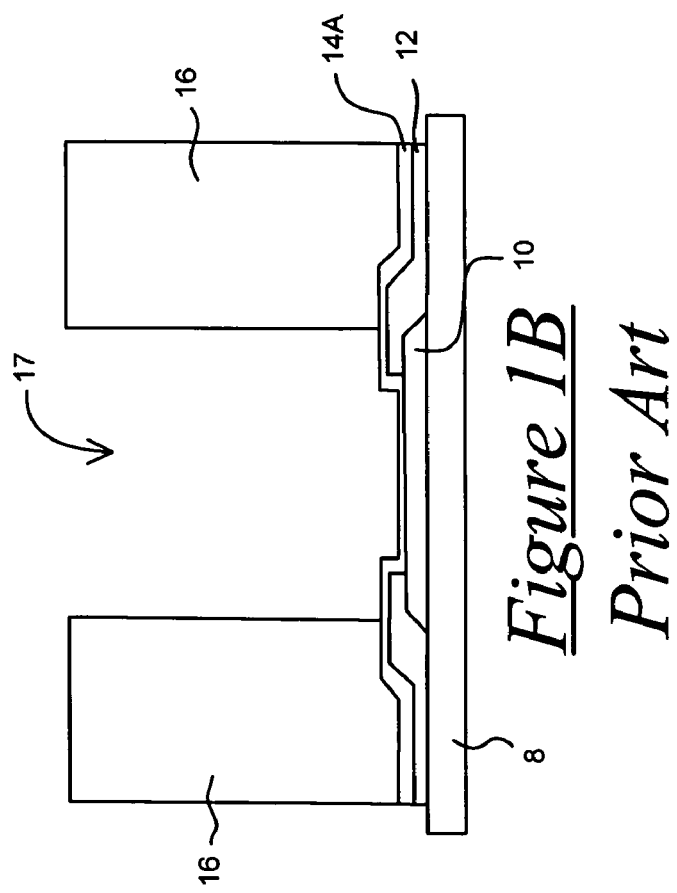
Figure 1C:
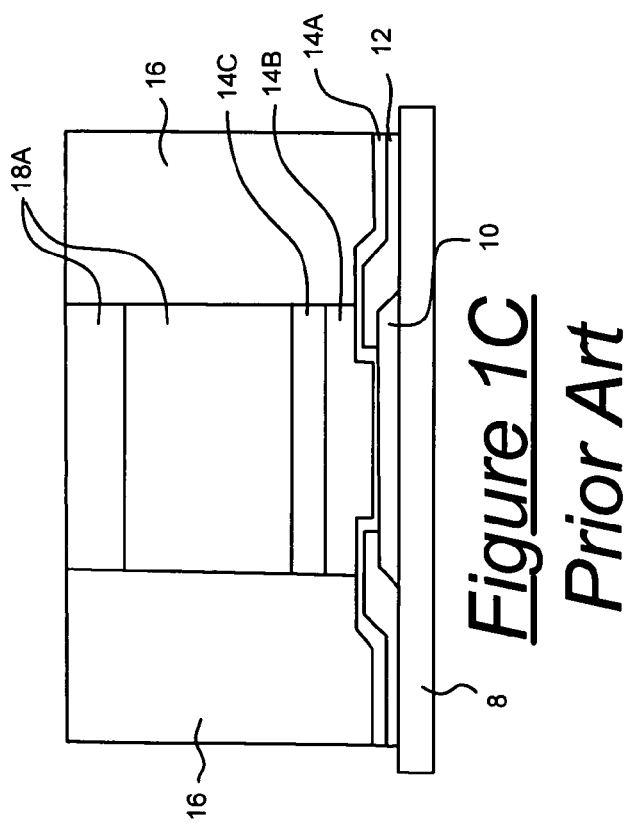
Figure 1D:
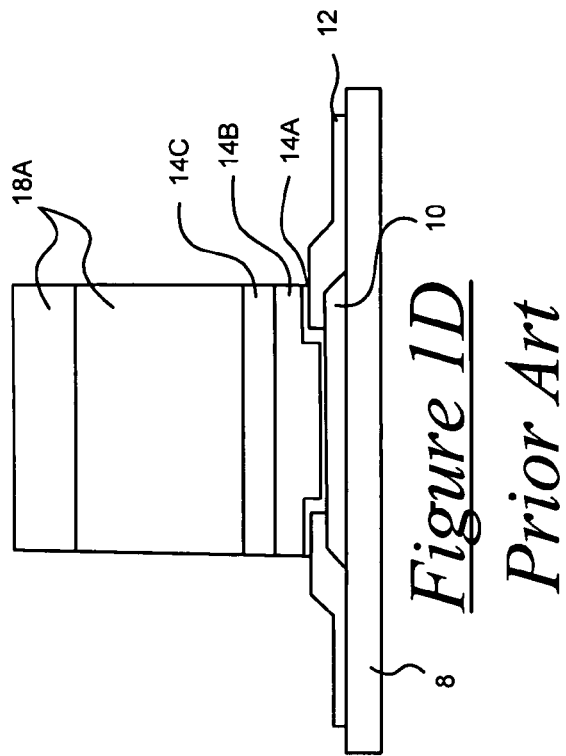
Figure 2B:
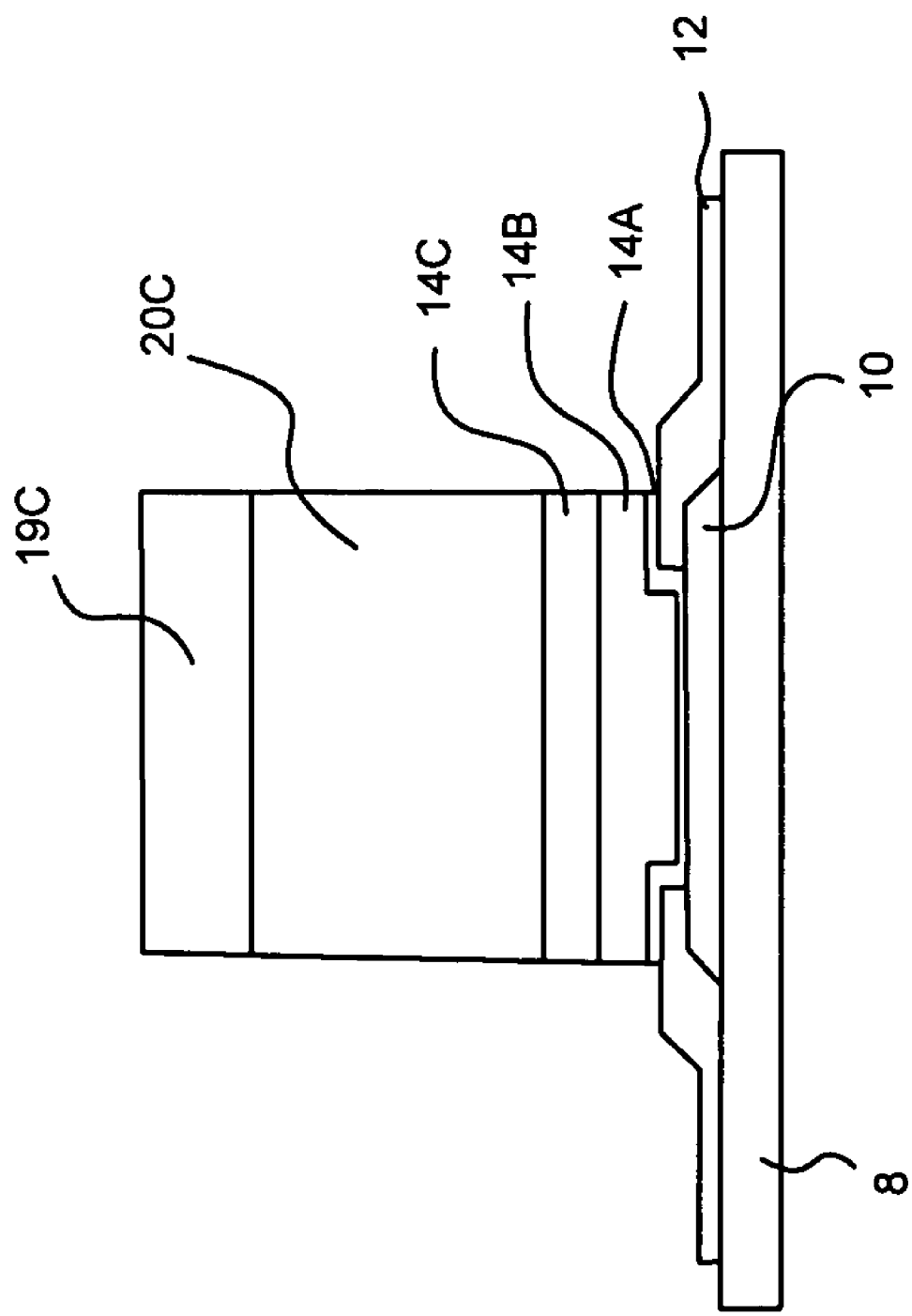
Figure 2C:
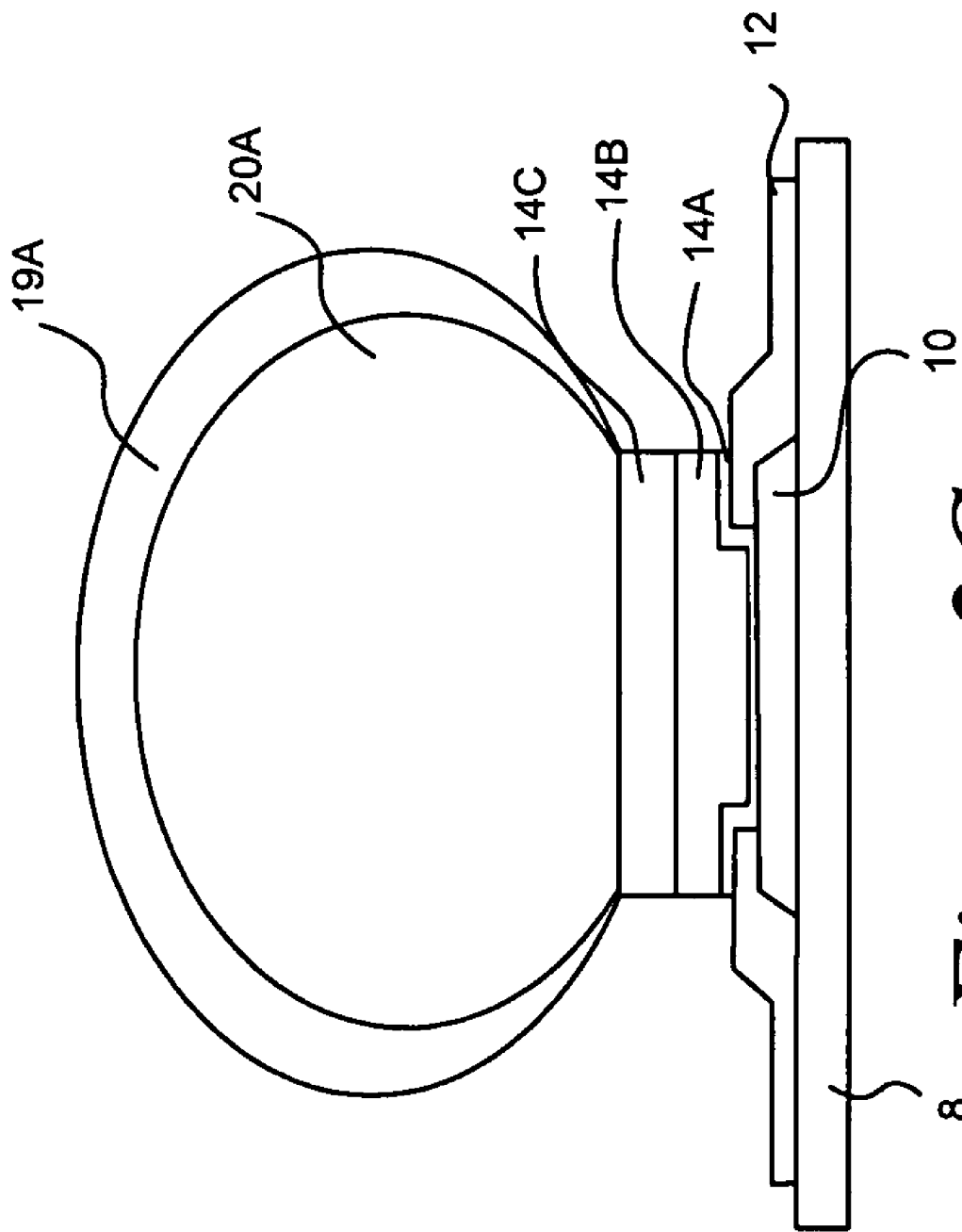

In an embodiment of the present invention, the method includes the steps of providing at least two UBM layers overlying a chip bonding pad including an uppermost UBM layer forming a contact layer for forming a solder bump thereon; depositing a solder bump precursor material containing high lead and eutectic solder regions, overlying the contact layer to form a solder column; exposing the sidewalls of the solder column to include the contact layer sidewalls; oxidizing the contact layer sidewalls to form a contact layer sidewall oxide at a temperature lower than the melting point of the solder bump material; and, forming a solder bump by reflowing the solder to wet the contact layer surface to exclude the contact layer sidewalls, whereby the solder bump contains a combination high lead solder with a layer of eutectic solder encompassing the high lead region of the bump. As shown in FIGS. 2A–2C, eutectic region 19A overlies high lead region 20A (other numerals are as noted in FIGS. 1A–1E). The approximate melting points of solder materials are as follows: Eutectic (180° C.); high lead (300° C. or above). Preferably, a eutectic pre-solder is applied to the substrate. The thicknesses of the surface layers are as follows: about 50–98 microns for the high lead layer, and about 1–5 microns for the eutectic layer; it is desirable to have the layers be as thin as possible. Additional details regarding general flip chip manufacture are disclosed in U.S. Pat. No. 6,541,366, herein incorporated by reference.

While the present invention has been described with respect to particular embodiments thereof, it is apparent that numerous other forms and modifications of the invention will be obvious to those skilled in the art. The appended claims and the present invention generally should be construed to cover all such obvious forms and modifications which are within the true spirit and scope of the present invention.

What is claimed is:

1. A method for improving a solder bump composition for a flip chip, comprising the steps of:
    providing at least two UBM layers overlying a chip bonding pad including an uppermost UBM layer forming a contact layer for forming a solder bump thereon;
    depositing a solder bump precursor material overlying the contact layer to form a solder column, wherein said solder bump precursor material contains a combination of high lead and eutectic solder regions;
    exposing the sidewalls of the solder column to include the contact layer sidewalls;
    oxidizing the contact layer sidewalls to form a contact layer sidewall oxide at a temperature lower than the melting point of the solder bump precursor material to make the contact layer sidewalls unwettable in a subsequent reflow process; and,
    forming a solder bump by reflowing the precursor material to wet the contact layer surface to exclude the contact layer sidewalls,
    whereby the solder bump contains a combination of a layer of high lead solder, with a layer of eutectic solder encompassing the high lead region of the bump, wherein the melting point of the high lead solder is about 300° C. or greater, and the melting point of the eutectic solder is about 180° C.

2. The method as recited in claim 1, wherein the high lead layer has a thickness of about 50–98 microns.

3. The method as recited in claim 1, wherein the eutectic layer has a thickness of about 1–5 microns.

4. A method for solder bump formation comprising:
    providing at least two UBM layers overlying a chip bonding pad including an uppermost UBM layer forming a contact layer for forming a solder bump thereon;
    depositing a solder bump precursor material overlying the contact layer to form a solder column, wherein said solder bump precursor material contains a combination of high lead and eutectic solder regions;
    exposing the sidewalls of the solder column to include the contact layer sidewalls;
    oxidizing the contact layer sidewalls to form a contact layer sidewall oxide at a temperature lower than the melting point of the solder bump precursor material to make the contact layer sidewalls unwettable in a subsequent reflow process; and,
    forming a solder bump by reflowing the precursor material to wet the contact layer surface to exclude the contact layer sidewalls,
    whereby the solder bump contains a combination of a layer of high lead solder, with a layer of eutectic solder encompassing the high lead region of the bump, wherein the melting point of the high lead solder is about 300° C. or greater, and the melting point of the eutectic solder is about 180° C.

5. The method as recited in claim 4, wherein the high lead layer has a thickness of about 50–98 microns.

6. The method as recited in claim 4, wherein the eutectic layer has a thickness of about 1–5 microns.

* * * * *